US009060416B2

(12) United States Patent
Supran et al.

(10) Patent No.: US 9,060,416 B2
(45) Date of Patent: Jun. 16, 2015

(54) CHARGING DOCKING SYSTEM

(71) Applicant: Dana Innovations, San Clemente, CA (US)

(72) Inventors: Ari Supran, San Clemente, CA (US); Scott Struthers, San Clemente, CA (US); Rob Roland, San Clemente, CA (US); Derick Dahl, Aliso Viejo, CA (US); Jim O'Dea, San Clemente, CA (US); Huy Bui, Irvine, CA (US); Ray Call, Mission Viejo, CA (US); Alex Bertagni, Lake Forest, CA (US)

(73) Assignee: DANA INNOVATIONS, San Clemente, CA (US)

( * ) Notice: Subject to any disclaimer, the term of this patent is extended or adjusted under 35 U.S.C. 154(b) by 0 days.

(21) Appl. No.: 14/046,787

(22) Filed: Oct. 4, 2013

(65) Prior Publication Data

US 2014/0036437 A1 Feb. 6, 2014

Related U.S. Application Data

(62) Division of application No. 13/603,986, filed on Sep. 5, 2012, now Pat. No. 8,553,408.

(60) Provisional application No. 61/531,316, filed on Sep. 6, 2011.

(51) Int. Cl.
*G06F 1/16* (2006.01)
*H05K 7/00* (2006.01)
(52) U.S. Cl.
CPC ............... *H05K 7/00* (2013.01); *G06F 1/1632* (2013.01)
(58) Field of Classification Search
None
See application file for complete search history.

(56) References Cited

U.S. PATENT DOCUMENTS

| 5,952,814 | A | 9/1999 | Van Lerberghe |
| 7,107,380 | B1 | 9/2006 | Mohan |
| 7,262,700 | B2 | 8/2007 | Hsu |
| D611,898 | S | 3/2010 | Yang |
| 7,697,963 | B1 | 4/2010 | Pomery |
| 7,715,187 | B2 * | 5/2010 | Hotelling et al. ........ 361/679.41 |

(Continued)

OTHER PUBLICATIONS

PCT International Preliminary Report on Patentability (Chapter I of the Patent Cooperation Treaty) for PCT/US2012/053765, Applicant: Dana Innovations et al., Form PCT/IB/326 and 373, dated Mar. 20, 2014 (8pages).

(Continued)

*Primary Examiner* — Anthony Q Edwards
(74) *Attorney, Agent, or Firm* — Vista IP Law Group LLP

(57) ABSTRACT

Systems and methods provide power to a device via a dock. A mounting base may include a mounting component, including a receiving area configured to removably receive a mating device at a plurality of orientations within a plane, wherein the mounting component comprises one or more indexing members and the mating device comprises one or more indexing elements, or the mating device comprises one or more indexing members and the mounting component comprises one or more indexing elements, the indexing members and elements configured to engage each other to align the mating device with the mounting component in one or more rotational orientations on said plane. A detector, configured to detect the presence of the mating device, and a driver circuit may be included. A device may be configured to control power sourced to the mating device by the driver circuit after the detector detects the mating device.

24 Claims, 16 Drawing Sheets

(56) References Cited

U.S. PATENT DOCUMENTS

| | | | |
|---|---|---|---|
| 7,889,494 B2* | 2/2011 | Stampfli | 361/679.42 |
| 7,906,936 B2 | 3/2011 | Azancot et al. | |
| 8,127,155 B2 | 2/2012 | Baarman et al. | |
| 8,780,549 B2* | 7/2014 | Aldana | 361/679.44 |
| 2003/0235029 A1 | 12/2003 | Doherty et al. | |
| 2005/0213298 A1 | 9/2005 | Doherty et al. | |
| 2008/0165478 A1* | 7/2008 | McCoy | 361/681 |
| 2008/0278899 A1* | 11/2008 | Hotelling et al. | 361/683 |
| 2009/0322278 A1* | 12/2009 | Franks et al. | 320/107 |
| 2010/0013431 A1* | 1/2010 | Liu | 320/108 |
| 2010/0072825 A1 | 3/2010 | Azancot et al. | |
| 2010/0073177 A1* | 3/2010 | Azancot et al. | 340/657 |
| 2010/0131691 A1* | 5/2010 | Chatterjee et al. | 710/303 |
| 2010/0171464 A1* | 7/2010 | Choi | 320/114 |
| 2010/0177476 A1* | 7/2010 | Hotelling et al. | 361/679.41 |
| 2010/0219183 A1 | 9/2010 | Azancot et al. | |
| 2010/0219693 A1 | 9/2010 | Azancot et al. | |
| 2010/0219697 A1 | 9/2010 | Azancot et al. | |
| 2010/0318709 A1 | 12/2010 | Bell et al. | |
| 2011/0050164 A1 | 3/2011 | Partovi et al. | |
| 2012/0074899 A1 | 3/2012 | Tsai et al. | |
| 2012/0176249 A1 | 7/2012 | Chatterjee et al. | |
| 2012/0202427 A1 | 8/2012 | Gioscia et al. | |
| 2012/0303851 A1 | 11/2012 | Tseng et al. | |

OTHER PUBLICATIONS http://www.bgr.com/2010/01/08/powermat-shows-us-their-2010-lineup-at-ces/, filed—Jan. 8, 2010.

http://www.engadget.com/2010/03/30/igrip-mount-brings-inductive-charging-to-your-windshield-video/, Filed—Mar. 30, 2010.

PCT International Search Report for PCT/US2012/053765, Applicant: Dana Innovations, Form PCT/ISA/210 and 220, dated Nov. 14, 2012 (4pages).

PCT Written Opinion of the International Search Authority for PCT/US2012/053765, Applicant: Dana Innovations, Form PCT/ISA/237, dated Nov. 14, 2012 (12pages).

* cited by examiner

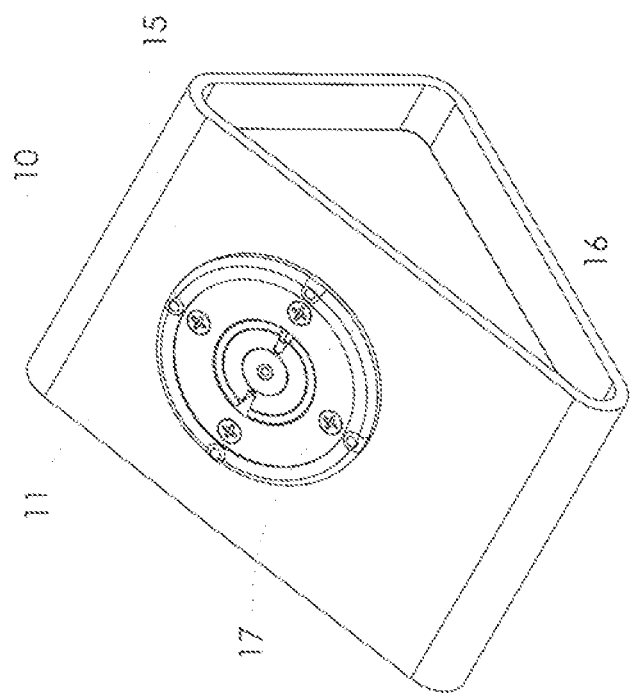

CHARGING DOCKING SYSTEM

CROSS-REFERENCE TO RELATED

The present application is a divisional of U.S. patent application Ser. No. 13/603,986, filed Sep. 5, 2012, now U.S. Pat. No. 8,553,408, issued on Oct. 8, 2013, which claims priority from U.S. Patent Application No. 61/531,316, filed Sep. 6, 2011. The content of each of the aforementioned applications is hereby incorporated herein by reference in its entirety. Priority to each of the aforementioned applications is hereby expressly claimed in accordance with 35 U.S.C. §§119, 120, 365, 371 and any other applicable statutes.

BACKGROUND OF THE INVENTION

1. Field of the Invention

The present description relates generally to docking stations for mobile electronic devices, and in particular to methods and systems for docking and providing power mobile electronic devices.

2. Description of the Related Art

Many types of conventional docking stations and mounts exist for mobile electronic devices. Often, the docking station requires that the mobile electronic device be carefully plugged in to a mating connector each time the mobile electronic device is docked. Lack of care during the docking process can lead to damage to the docking station or mobile electronic device. To prevent this damage, the docking station may be constructed with a cavity or well to receive the mobile electronic device. The cavity or well of the docking station may help prevent damage due to lack of care during docking but do not prevent long time wear and tear on the docking station and the mobile electronic device mating connectors.

Recently, both conductive and inductive mats have been developed such as the WildCharge conductive charging mat the PowerMat inductive charging mat. The conductive and inductive charging mats often require that the mobile electronic device be inserted in a sleeve. The WildCharge mat is much larger than the WildCharge sleeve and the mobile electronic device. The PowerMat uses a slight well to receive the mobile electronic device and to position the mobile electronic device properly while charging. Charging mats are intended to be used on a relatively flat and horizontal surface and the mobile electronic device is not easily used while charging. Existing inductive chargers have been developed for low power devices that require 1 amp or less of charging current. Mobile electronic devices such as the Apple iPad require up to 2.1 amp of charging current so existing charging mats can't be used to charge the iPad. Certain inductive charging stations require that the device being charged be at a fixed orientation.

Non-charging mounts for mobile electronic devices have also been developed that allow the mobile electronic device to be held and operated in multiple orientations. The mounts require a cable from an external charger be plugged in to the mobile electronic device to charge or maintain a charge during use. The use of a charging cable in this type of mount restricts the movement or position of the mobile electronic device and will create the possibility of wear or damage to the mobile electronic devices charging connector and charging cable.

Semi-permanent mounts with integrated charging have also been developed such as the iPort CM-IW2000 that allow mobile electronic devices such as the iPad to be wall mounted and remain fully charged. The CM-IW2000 holding the iPad remains fixed in one position or orientation that is determined at the time the mounting hole for the CM-IW2000 is cut in a wall. The CM-IW2000 utilizes magnets to firmly secure the iPad in the mount and was not designed to allow the iPad to be removed easily and used as a mobile device.

SUMMARY OF THE INVENTION

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An example embodiment provides a mounting component for use in a docking system for a mobile electronic device, the mounting component comprising: a mounting portion removably coupleable to a mounting section of the docking system for coupling a mobile electronic device to the docking system, the mounting portion comprising: a coupling mechanism configured to removably couple the mounting portion to the mounting section, a mounting surface that extends along a plane generally parallel to a base surface of the mounting component, one or more indexing members disposed along at least a portion of the mounting surface of the mounting portion, said indexing members configured to removably engage one of a plurality of corresponding indexing elements on the mounting section to align the mounting section with the mounting portion in one or more rotational orientations on said plane, and a coil, wherein the coil is configured to inductively communicate power from a power source included in the docking system at a plurality of orientations in said plane.

Optionally, the mounting portion is pivotable relative to a horizontal plane to one or more angular positions that define a different angle between the mounting surface and the horizontal plane. Optionally, said mounting portion protrudes from said base surface, and a circumference of the mounting portion is circular in shape and defined about a central axis of symmetry. Optionally, the coupling mechanism comprises a magnet configured to exert a magnetic force between the mounting portion and the mounting section to maintain the mounting portion coupled to the mounting section, wherein the magnetic force on the mounting section is in an amount sufficient to maintain the mounting section coupled to the mounting portion while adjusting the rotational orientation of the mounting section relative to the mounting portion. Optionally, the coupling mechanism comprises a magnet configured to exert a magnetic force between the mounting portion and the mounting section to maintain the mounting portion coupled to the mounting section and the magnet is configured to exert a magnetic force on the mounting section in an amount sufficient to maintain the mounting section coupled to the mounting portion while adjusting the rotational orientation of the mounting section relative to the mounting portion, wherein the mounting portion is configured to attach to a wall and the magnet is configured to exert a magnetic force between the mounting portion and mounting section in an amount sufficient to maintain the mobile electronic device, including a display thereon, in a generally vertical orientation. Optionally, the coupling mechanism is configured to maintain the mounting section coupled to the mounting portion and to facilitate an electrical connection between the mounting portion and the mounting section. Optionally, the one or more indexing members comprise a plurality of protrusions on the mounting surface and the protrusions are spaced apart along at least a portion of a circumference of the mounting surface to align the mounting section with the mounting portion in one or more discrete rotational orientations on said plane. Optionally, the mounting portion is coupled to the mounting section of the docking system, the coil is configured to inductively communicate power from the power source included in the mounting section regardless of the mounting component's orientation in said plane. Optionally, the mounting component further comprises at least one exposed electrical contact configured to be in electrical communication with at least one exposed electrical contact on the mounting section. Optionally, the mounting component further comprises a sleeve configured to removably receive the mobile electronic device.

An example embodiment includes a docking system for a mobile electronic device, comprising: a mounting portion removably attachable to a support surface, the mounting portion comprising a mounting surface that extends along a plane generally parallel to a base surface of the mounting portion; a mounting section on a rear surface of a mobile electronic device, the mounting section having a shape corresponding to a shape of the mounting portion and removably coupleable to the mounting portion via a coupling mechanism to support the mobile electronic device on the support surface, wherein one of the mounting portion and mounting section comprises one or more indexing members and the other of the mounting portion and mounting section comprises one or more indexing elements, the indexing members and elements configured to engage each other to align the mounting section with the mounting portion in one or more rotational orientations on said plane; and a detector configured to detect the presence of the mounting portion or the mobile electronic device; a driver circuit; a first device configured to control the sourcing of power to the mobile electronic device by the driver circuit at least partly in response to the detector detecting the presence of the mounting portion or the mobile device.

Optionally, the mounting section is disposed on a sleeve removably attachable to the mobile electronic device. Optionally, the mounting section is disposed on a sleeve removably attachable to the mobile electronic device and the sleeve comprises one or more heat sinks configured to dissipate heat generated by one or both of a charging circuit of the sleeve and the mobile electronic device. Optionally, the mounting portion is pivotable relative to a horizontal plane to one or more angular positions that define a different angle between the mounting surface and the horizontal plane. Optionally, one of the mounting portion and mounting section defines a male component and the other of the mounting portion and mounting section defines a female component, the female component configured to removably receive the male component to couple the mounting portion to the mounting section, and a circumference of the mounting portion and mounting section is circular in shape and extends about a central axis. Optionally, the coupling mechanism comprises a magnet on one of the mounting portion and mounting section, the magnet configured to exert a magnetic force between the mounting portion and mounting section to maintain the mounting portion coupled to the mounting section, wherein the magnetic force is in an amount sufficient to maintain the mounting section coupled to the mounting portion while adjusting the rotational orientation of the mounting section relative to the mounting portion. Optionally, the coupling mechanism comprises a magnet on one of the mounting portion and/or the mounting section, the magnet configured to exert a magnetic force between the mounting portion and mounting section to maintain the mounting portion coupled to the mounting section and the magnet is configured to exert a magnetic force in an amount sufficient to maintain the mounting section coupled to the mounting portion while adjusting the rotational orientation of the mounting section relative to the mounting portion, wherein the mounting portion is configured to attach to a wall and the magnet is configured to exert a magnetic force between the mounting portion and mounting section in an amount sufficient to maintain the mobile electronic device, and a display thereon, in a generally vertical orientation. Optionally, said indexing members and indexing elements align the mounting portion and mounting section so as to align an electrical connection between the mounting portion and mounting section. Optionally, one of the indexing members and indexing elements comprises a plurality of protrusions and the other of the indexing members and indexing elements comprises a plurality of indentations sized to engage the protrusions and the protrusions and indentations are spaced apart along at least a portion of a circumference of the mounting portion and mounting section so as to align the mounting section with the mounting portion in one or more discrete rotational orientations on said plane. Optionally, the mounting portion includes a first coil coupled to the driver circuit and the mounting section includes a second coil configured to inductively receive power from the first coil. Optionally, the mounting portion includes a first coil coupled to the driver circuit and the mounting section includes a second coil configured to inductively receive power from the first coil, wherein the second coil is configured to inductively receive power from the first coil regardless of the mounting section's orientation in said plane.

An example embodiment includes a mounting base comprising: a mounting component, the mounting component including a receiving area configured to removably receive a mating device at a plurality of orientations within a plane, wherein the mounting component comprises one or more indexing members and the mating device comprises one or more indexing elements, or the mating device comprises one or more indexing members and the mounting component comprises one or more indexing elements, the indexing members and elements configured to engage each other to align the mating device with the mounting component in one or more rotational orientations on said plane; and a detector configured to detect the presence of the mating device; a driver circuit; a first device configured to control the sourcing of power to the mating device by the driver circuit at least partly in response to the detector detecting the presence of the mating device.

Optionally, the mating device comprises a sleeve configured to receive a tablet computing device. Optionally, the mating device comprises a tablet computer or a phone. Optionally, the mounting base further comprises a driver coil coupled to the driver circuit, wherein the driver coil is configured to inductively provide power from the driver circuit to the mating device while the mating device is located at the receiving area. Optionally, the mounting base is configured to conductively provide power from the driver circuit to the mating device while the mating device is located at the receiving area. Optionally, the first device is configured to cause, at least in part, the driver circuit to operate in a low power mode when the detector fails to detect a proper positioning of the mating device with respect to the receiving area. Optionally, the detector magnetically senses the presence of the mating device. Optionally, a circumference of the receiving area is circular in shape and defined about a central axis of symmetry. Optionally, the mounting component comprises a magnet or a ferrous metal configured to magnetically couple the mounting base to the mating device.

An example embodiment includes a docking system including a sleeve and base. The sleeve may be a form fitted sleeve for a mobile electronic device. The base may be configured to hold the sleeve at multiple planes and/or multiple orientations within a single plane. The base may be a table top base. The sleeve is supported on the base using mechanical design features and or magnetic force. The docking system includes at least one indention and the at least one corresponding protrusion for locating the desired position of the sleeve on the base when docking and to allow rotation of the sleeve to alternative operating positions on axis after the sleeve is docked. The sleeve includes a connector port interface to the mobile electronic device. The base includes a connector port interface to an external power source. The docking system optionally includes an inductive charging function for the battery within the mobile electronic device.

An example embodiment includes a docking system including a sleeve and base. The docking system includes a sleeve and base. The sleeve may be a form fitted sleeve for a mobile electronic device. The base may be configured to hold the sleeve at multiple planes and/or multiple orientations within a single plane. The sleeve is supported on the base using mechanical design features and/or magnetic force. The base may be a table top base. The sleeve is supported on the base using mechanical design features and/or magnetic force. The docking system may include at least one indention and the at least one corresponding protrusion for locating the desired position of the sleeve on the base when docking and to allow rotation of the sleeve to alternative operating positions on axis after the sleeve is docked. The sleeve includes a connector port interface to the mobile electronic device. The base includes a connector port interface to an external power source. The docking system includes a conductive charging function for the battery within the mobile electronic device.

An example embodiment includes a docking system including a sleeve and base. The sleeve may be a form fitted sleeve for a mobile electronic device and the base may be configured to hold the sleeve at multiple orientations within a single plane. The sleeve is supported on the base using mechanical design features and/or magnetic force. The base may be an in-wall base. The sleeve is supported on the base using mechanical design features and/or magnetic force. The docking system includes at least one indention and the at least one corresponding protrusion for locating the desired position of the sleeve on the base when docking and to allow rotation of the sleeve to alternative operating positions on axis after the sleeve is docked. The sleeve includes a connector port interface to the mobile electronic device. The base includes a connector port interface to an external power source. The docking system optionally includes an inductive charging function for the battery within the mobile electronic device.

An example embodiment includes a docking system including a sleeve and base. The sleeve may be a form fitted sleeve for a mobile electronic device and the base may be configured to hold the sleeve at multiple orientations within a single plane. The sleeve is supported on the base using mechanical design features and/or magnetic force. The base may be an in-wall base. The sleeve is supported on the base using mechanical design features and/or magnetic force. The docking system includes at least one indention and the at least one corresponding protrusion for locating the desired position of the sleeve on the base when docking and to allow rotation of the sleeve to alternative operating positions on axis after the sleeve is docked. The sleeve includes a connector port interface to the mobile electronic device. The base includes a connector port interface to an external power source. The docking system optionally includes a conductive charging function for the battery within the mobile electronic device.

An example embodiment includes a docking system including a sleeve and base. The sleeve may be a form fitted sleeve for a mobile electronic device and the base may be configured to hold the sleeve at multiple orientations within a single plane. The sleeve is supported on the base using mechanical design features and/or magnetic force. The base may be a flat surface base. The sleeve is supported on the base using mechanical design features and/or magnetic force. The docking system includes at least one indention and the at least one corresponding protrusion for locating the desired position of the sleeve on the base when docking and to allow rotation of the sleeve to alternative operating positions on axis after the sleeve is docked. The sleeve includes a connector port interface to the mobile electronic device. The base includes a connector port interface to an external power source. The docking system optionally includes an inductive charging function for the battery within the mobile electronic device.

An example embodiment includes a docking system including a sleeve and base. The sleeve may be a form fitted sleeve for a mobile electronic device and the base may be configured to hold the sleeve at multiple orientations within a single plane. The sleeve is supported on the base using mechanical design features and/or magnetic force. The base may be a flat surface base. The sleeve is supported on the base using mechanical design features and/or magnetic force. The docking system optionally includes at least one indention and the at least one corresponding protrusion for locating the desired position of the sleeve on the base when docking and to allow rotation of the sleeve to alternative operating positions on axis after the sleeve is docked. The sleeve includes a connector port interface to the mobile electronic device. The base includes a connector port interface to an external power source. The docking system includes a conductive charging function for the battery within the mobile electronic device.

BRIEF DESCRIPTION OF THE DRAWINGS

The disclosed aspects will hereinafter be described in conjunction with the appended drawings, provided to illustrate and not to limit the disclosed aspects, wherein like designations denote the elements.

FIG. 5 is a front perspective view of an example docking system table top base without cover;

DETAILED DESCRIPTION OF PREFERRED EMBODIMENTS

Disclosed herein are methods and systems of powering and/or charging mobile device. Certain embodiments provide a mobile device docking station that enables power to be provided to a mobile device at multiple orientations. Certain embodiments of the docking station are configured to charge a mobile device battery. Certain embodiments of the docking station are configured to supply power to the mobile device inductively and/or conductively.

In view of the deficits of conventional docking systems, such as those discussed above, there is a need for an improved docking system for mobile electronic devices that does not require plugging charging cables or docking connectors every time the mobile electronic device is charged, allows ease of use of the mobile electronic device during charging, permits multiple orientations of the device and allows the mobile electronic device to remain mobile and easily docked and unlocked without excessive care.

Embodiments of a docking system is disclosed. As described in greater detail below, in certain embodiments, the docking system may include a sleeve and base. The sleeve may be a form fitted sleeve for a mobile electronic device. The base may be configured to hold the sleeve at multiple planes and or multiple orientations within a single plane. The sleeve is supported on the base using mechanical design features and/or magnetic force. The docking system may include at least one indention and at least one corresponding protrusion for locating the desired position of the sleeve on the base when docking and to allow rotation of the sleeve to alternative operating positions on axis after the sleeve is docked. The sleeve may include a connector port interface to the mobile electronic device. The base may include a connector port interface to an external power source. The docking system may include a conductive and/or inductive charging function for the battery within the mobile electronic device.

Figure 1:
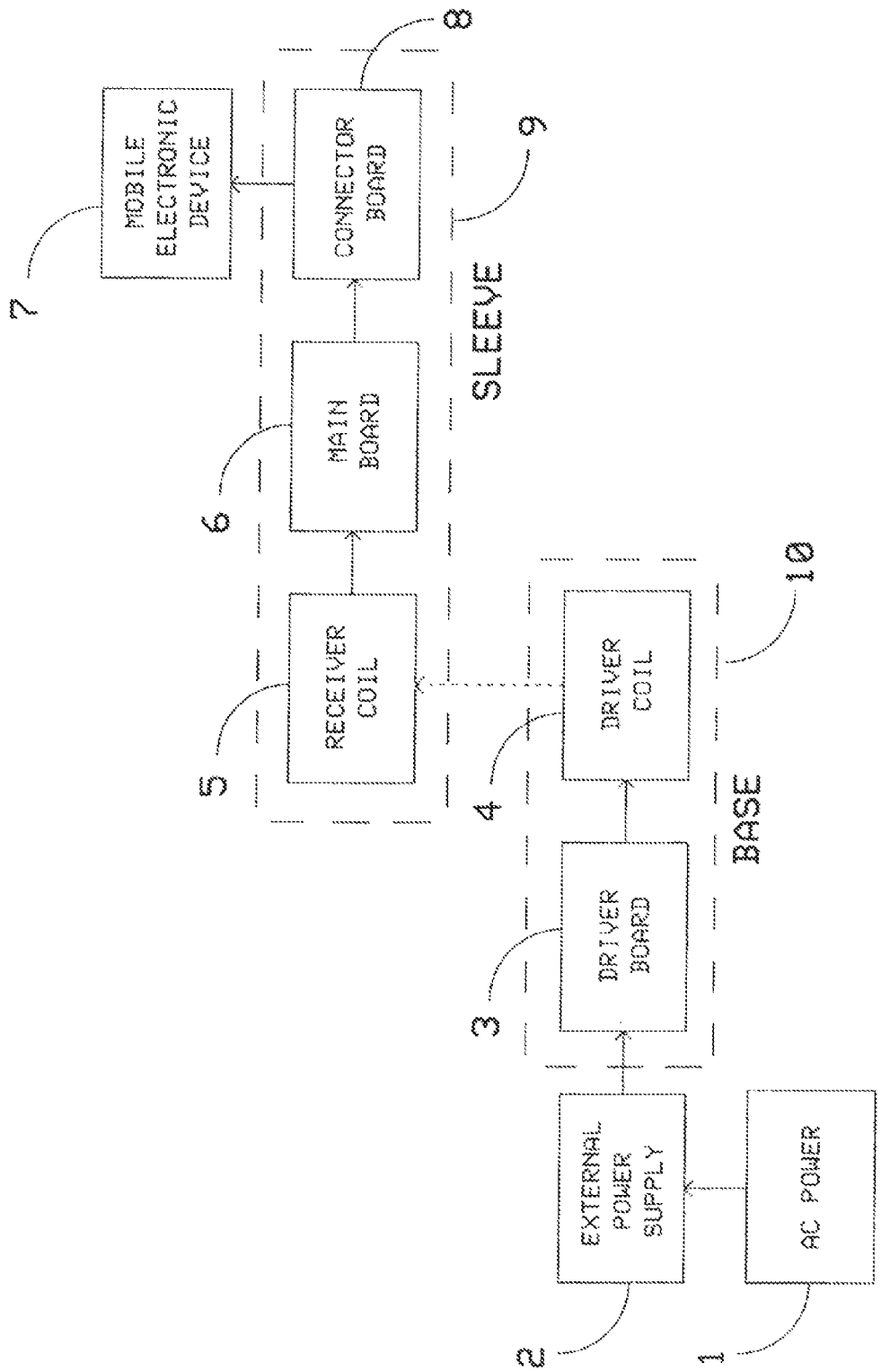
FIG. 1 is a block diagram of an example docking system inductive charging circuitry.

Referring to the drawings FIG. 1, is a simplified block diagram of inductive charging electronics for a docking system. The use of an inductive charging circuit in a docking station provides improvement over docking stations that require that the mobile electronic device be plugged in to a connector or cable that provides charging. Inductive charging is an improved method of charging that does not require electrical conducting connectors between the base 10 and the sleeve 9.

Referring more particularly to FIG. 1, AC power 1 may be used provide a source of power for a docking system, AC power 1 may range for example from 90 V AC to 240 V AC at 50 Hz to 60 Hz depending on where you are located in the world, other AC power voltages and frequencies may also be used. The external power supply 2 receives input AC power for example of 90 V AC to 240 V AC at 50 Hz to 60 Hz from AC power 1. The external power supply can be a wall mounted unit that is plugged directly in to an AC power 1 outlet and may use country specific plug adapters to mate with the style of AC power 1 outlet. A power source such as an external power supply 2 provides input power for the driver board 3 of the docking system base 10. A DC power input from a battery system in a vehicle such as an automobile could also be used in place of the AC power and external power supply to provide input to the driver board 3. The driver board 3 is used to drive electrical current in to the driver coil 4 at a frequency range for example of 60 KHz to 130 KHz, other frequencies may be used. The driver board 3 may be implemented using a small programmable micro controller allowing use of various sensor inputs and allow various modes of operation. A sensor may be included on the driver board 3 or within the base 10 that senses when the sleeve 9 is docked on the base 10. A magnetic sensor on the driver board 3 or base may be used to detect the magnetic field from a permanent magnet in the sleeve 9 as an indication that the sleeve 9 has been docked on the base 10. A current sensor may be included on the driver board 3 and used to detect the change in driver board 3 current when the sleeve 9 is docked on the base 10. The base 10 may use the detection of the sleeve 9 to change the operating mode of the driver board 3. The driver board 3 may have several operating modes including a power saving low power sleep mode when the sleeve 9 is not docked on the base 10.

The low power mode, for example, may draw less than 1 W of power from the AC power input when the sleeve 9 is not docked on the base 10. The driver board 3 may also use a current sensor to determine when to change charging modes and also to monitor and control the charging of the mobile electronic device 7. The mobile electronic device 7 may require much more current to recharge the mobile electronic device's batteries when the batteries are very low. The driver board 3 may sense the current need of the mobile electronic device 7 using a current sensor and vary the driver board 3 drive current as needed.

The driver board 3 may also include a temperature sensor. A temperature sensor may be used by the driver board 3 to change operating modes of the driver board 3 based on ambient temperatures. The driver board 3 may change operating modes to a low power mode if high ambient or driver board 3 temperature is detected.

The docking system may be designed to pass radiated emission and conducted emission FCC specifications. The driver board 3 may cause undesired excessive radiated and conducted emissions when driving current to a driver coil 4 during charging. To minimize or reduce radiated emissions and conducted emissions caused by driving current to a driver coil 4, the frequency of the driver board 3 coil drivers may be varied within the optimum operating frequency range of the docking system reducing peak level of measured emissions.

The driver coil 4 may consist of multiple turns of wire. Multi-strand wire may be used for the driver coil 4. The use of multi-strand wire for the driver coil 4 increases efficiency of the drive coil 4 and reduces heat generated by the drive coil 4. The multi-strand wire used for the drive coil 4 may have individual strands of wire that are as thin as 40 AWG for example and may consist of 50 or more strands of wire. The drive coil 4 may further have multiple turns of wire forming the coil on the bobbin that held is by the ferrite pot core. The ferrite core helps focus the energy of the driver coil 4 to the receiver coil 5. The use of a ferrite pot core with the drive coil 4 increases the power that may be transferred to the receiver coil 5 allowing the inductive charging circuit to achieve the higher current demands of devices such as an iPad for example a may need over 2 amps of charging current at 5 volts.

The receiver coil 5 may be located in the sleeve 9. The receiver coil 5 may be implemented as a coil formed with etched copper using a printed circuit board. The use of a circuit board for the receiver coil 5 reduces the overall thickness of the receiver coil 5 and therefore reduces the space required for the receiver coil 5 within the sleeve 9. The receiver coil 5 may use both outer surfaces of the receiver coil 5 printed circuit board when fabricated using double sided copper clad printed circuit board material. The receiver coil 5 may alternately be fabricated using multilayer printed circuit board material allowing the turns of the receiver coil 5 represented in etched copper be placed in series therefore increasing the turns of the receiver coil 5 and increasing the receiver coil 5 AC voltage level that is determined by the ratio of the receiver coil 5 windings to driver coil 4 windings or in parallel reducing the resistance of the receiver coil 5 therefore increasing the receiver coil 5 current carrying capability and reducing the receiver coil 5 heat caused by the current flow during charging the mobile electronic device 7 resulting in a voltage drop caused by resistance of the receiver coil 5. A flat piece of ferrite material may be placed on the side of the receiver coil 5 printed circuit board that is most distant from the driver coil 4 when the sleeve 9 is docked on a base 10. A flat ferrite piece on the back of the receiver coil 5 may be used to increase the efficiency of the transfer of power between the driver coil 4 and the receiver coil 5 over the space or gap between the two coils. The receiver coil 5 may also fabricated using copper wire wound to form a coil and backed with a flat piece of ferrite material.

The main board 6 may be located in a sleeve 9 receives the AC input from a receiver coil 5. A capacitor may be used in parallel with the receiver coil 5 to for near to resonance operation of the receive circuit. At resonance the transfer function of energy to the receive coil may approach 1 and therefore increase the efficiency of the inductive charging circuit allowing the circuit to deliver the higher charging currents required by mobile electronic devices such as the iPad. The AC input from a receiver coil 5 may be rectified in to unregulated DC voltage by a full wave bridge on a main board 6. The unregulated DC voltage from the bridge rectifier may be used as the input for a DC to DC switching power regulator circuit on the main board 6.

The use of a switching power regulator on a main board 6 may improve the efficiency for example from 20% to nearly 90% of the conversion of unregulated DC voltage input to regulated voltage output over the use of conventional linear voltage regulators. The switching power regulator may be configured to output regulated +5 VDC output or other voltage for charging a mobile electronic device 7. The output of a main board's 6 regulated DC output is used as the input to a connector board 8. The connector board 8 may be located in the sleeve 9 and may include a mating connector 27 for the charging port on the mobile electronic device 7. The connector board 8 may also include a connector that is accessible from the outside of the sleeve 9 that allows an alternate method to charge the mobile electronic device 7 using a conventional charger.

The mobile electronic device 7 charging port may plug in to a mating connector on the connector board 8 when a mobile electronic device 7 inserted in to the sleeve 9. The sleeve 9 may be intended to remain in place on the mobile electronic device 7 semi-permanently and does not need to be removed for normal use of the mobile electronic device 7. The sleeve 9 may be form fitting and also may provide a level of increased protection for the mobile electronic device 7. The mobile electronic device 7 installed in the sleeve 9 may be placed on the base 10 to charge the mobile electronic device 7. Optionally, no additional plugging of cables or connectors are required to charge the mobile electronic device 7 when installed in the sleeve 9 and placed on the base 10 that is receiving power from an external power supply 2. The driver coil 4 of the base 10 may need to be aligned properly with the receiver coil 5 in the sleeve 9 to properly transfer power and allow charging of the mobile electronic device 7.

Smaller magnets 35 in the sleeve 9 may be used to attract to ferrous metal in the base 10. A combination of magnetic force and mechanical design features of a base 10 and a sleeve 9 may be used to enable the sleeve 9 to be easily docked properly aligning the receiver coil 5 and the driver coil 4 on the base 10 without excessive care from the intended user. The mechanical design features of the base 10 and the sleeve 9 also allow the sleeve 9 to be rotated to any position within a single plane while a sleeve 9 is installed on the base 10. The magnetic force may be used to hold the base 10 and sleeve 9 together with enough force to allow the mobile electronic device 7 to be used normally while docked. The magnetic force between the sleeve 9 and base 10 may be such that it is not strong enough to prevent the mobile electronic device 7 held in the sleeve 9 from easily being undocked by a user and used as a mobile device.

Figure 2:
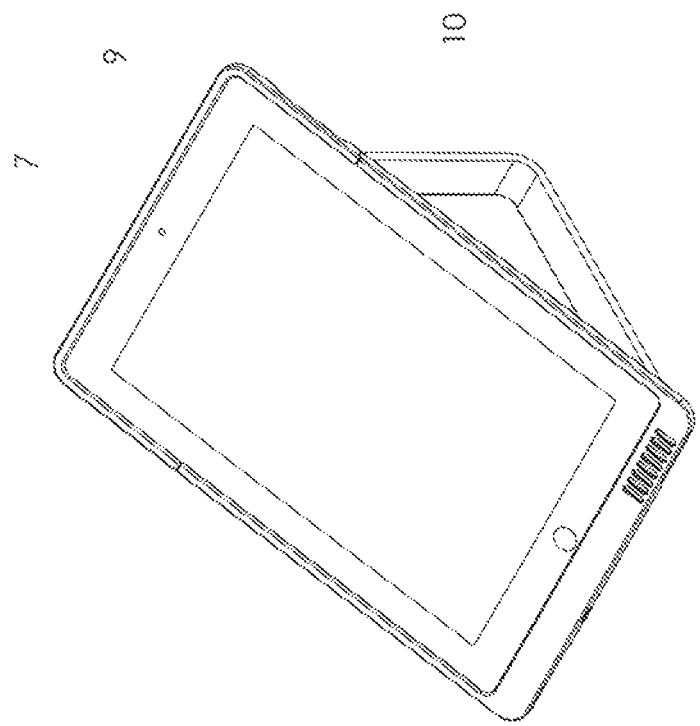
FIG. 2 is a front perspective view of an example docking system with table top base.

Referring to the drawing FIG. 2, is a front perspective view of a docking system with table top base.

FIG. 2 shows the docking system when the sleeve 9 and the mobile electronic device 7 is docked on the base 10. The base 10 may be constructed to hold the sleeve 9 and the mobile electronic device at any angle that allows the mobile electronic device 7 to be easily used while docked on a base 10. The base 10 may have weight added for stability of the docking system. The sleeve 9 holding the mobile electronic device 7 may be rotated to any position within a single plane while the sleeve 9 is docked on the base 10. The base 10 may alternately be constructed as a free standing module with a mating surface for the sleeve 9 at any useful angle or with a mating surface for the sleeve 9 that allows the mating surface angle or plane to be adjustable.

Figure 3:
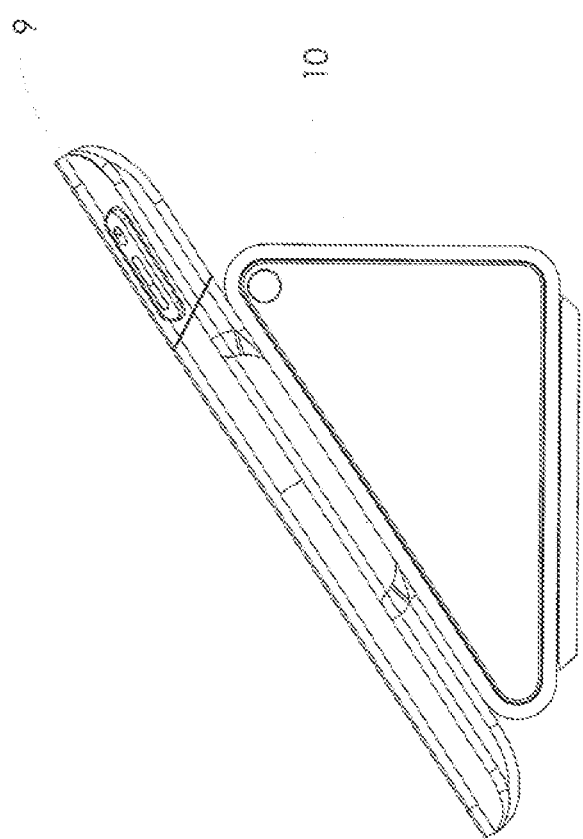
FIG. 3 is a side view of an example docking system with table top base.

Referring to the drawing FIG. 3, is a side view of a docking system with table top base. FIG. 3 shows a docking system when a sleeve 9 is docked on a base 10.

Figure 4:
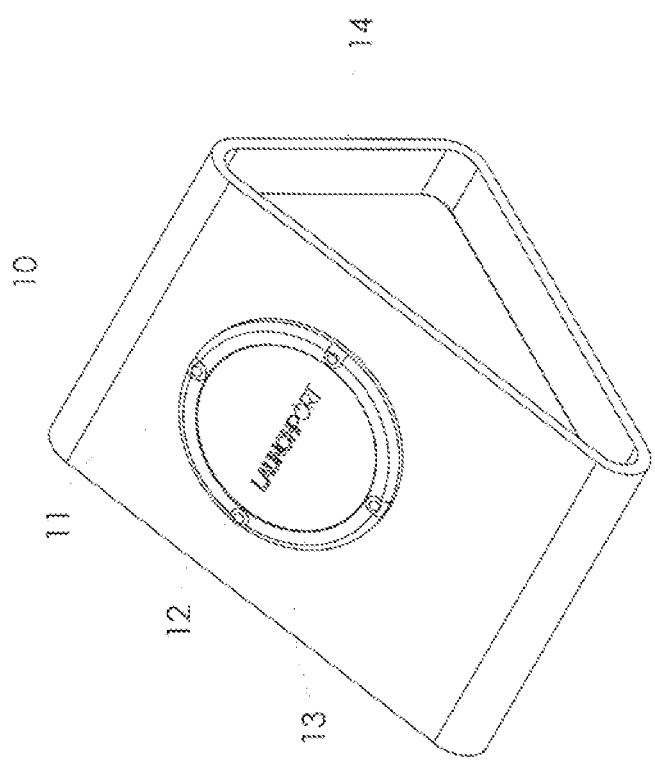
FIG. 4 is a front perspective view of an example docking system table top base.

Referring to the drawing FIG. 4, is a front perspective view of a docking system table top base. The base 10 may have protrusion 11. The protrusion 11 may be circular or other shapes may be used. The base 10 may have a protrusion 11 that may be used to mate with an indention 31 on the sleeve 9 when the sleeve 9 is docked on the base 10. The base 10 may also have smaller protrusions 12 that mate with smaller indentions 32 on the sleeve 9. The smaller protrusions 12 may be circular or other shapes may be used. Mobile electronic devices 7 may have user displays that may be orientated in portrait or landscape positions. Mobile electronic devices 7 may automatically change the orientation of the user screen based on how the mobile electronic device 7 is being held. The smaller protrusions 12 on a base 10 may be used to easily locate desired operating positions of the mobile electronic device 7 when docked on the base 10. The protrusion 11 may include a driver coil 4 cover 13. The driver coil cover 13 may be made of durable material and thin allowing the driver coil 4 of the base 10 to be located near the surface that will mate with the indention 31 of the sleeve 9. The base 10 housing may be made of aluminum and fabricated using an extrusion process.

The base 10 housing may be made of plastic. The base 10 may have side panels 14 made of plastic. In this example, the base 10 has protrusions and the sleeve 9 has indentations. In other embodiments, the base 10 may have indentations and the sleeve 9 may have protrusions. In other embodiments, the base 10 may have both protrusions and indentations and the sleeve 9 may have both protrusions and indentations.

Referring to the drawing FIG. 5, is a front perspective view of a docking system table top base with the driver coil cover 13 shown in FIG. 4 removed. When the driver coil cover 13 is removed the driver coil 4 pot core 15 and bobbin 16 are exposed. Ferrous material in the base 10 is used to attract and hold the sleeve 9 when docked. Metal screws 17 may serve two purposes, the first purpose may be to secure the components making up the protrusion 11 assembly to the base 10, the second purpose may be the ferrous material of the screws 17 are attracted to the smaller magnets 34 in the sleeve 9 and hold the sleeve 9 to the base 10 while the sleeve 9 is docked.

Figure 6B:
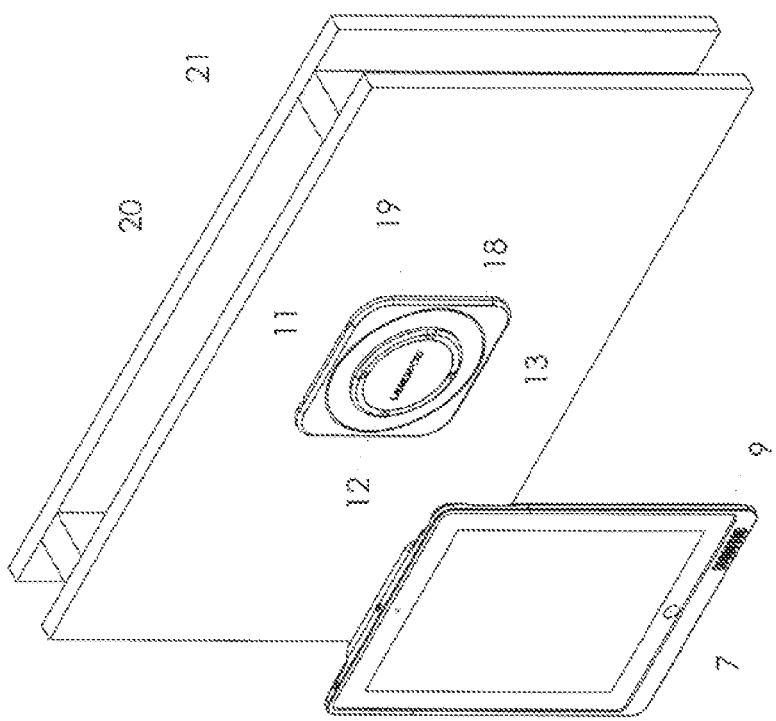
FIG. 6B is a front perspective exploded view of an example docking system with in-wall base with sleeve in portrait position.
Figure 6A:
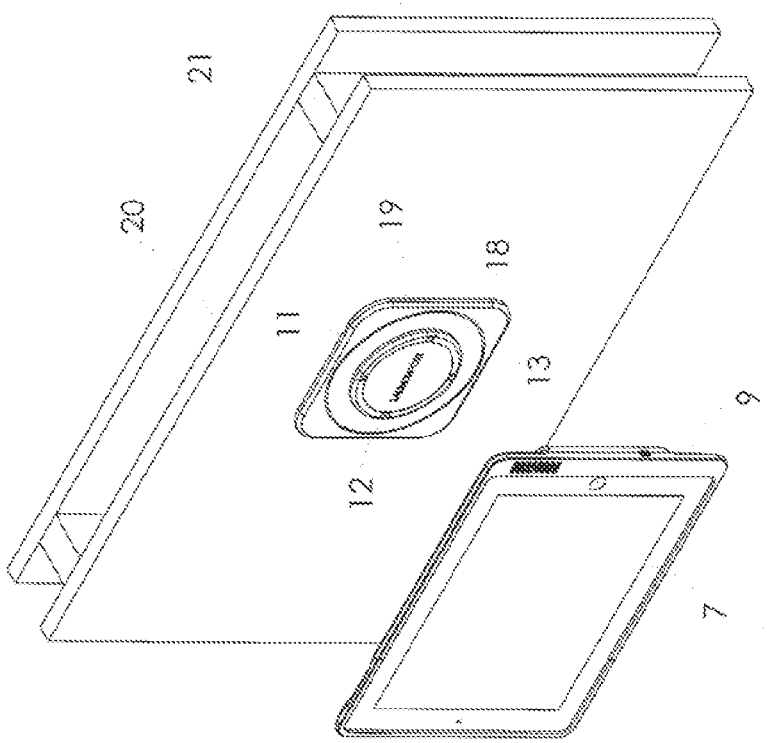
FIG. 6A is a front perspective exploded view of an example docking system with in-wall base with sleeve in landscape position.

Referring to the drawings FIGS. 6A and 613, are front perspective exploded views of a docking system in-wall base with the sleeve in landscape position FIG. 6A and portrait position FIG. 6B. The sleeve 9 may be docked to the base 10 in multiple positions within a single plane. FIG. 6A show a sleeve 9 in the portrait position. The mobile electronic device 7 held in the sleeve 9 may automatically change the orientation of its user touch screen to the landscape position when rotated as shown in FIG. 6A or to the portrait position as shown in FIG. 6B. The in-wall base 19 may be very similar to the table top base 10 described in FIG. 1 through FIG. 5. The in-wall base 19 may have a protrusion 11 that may be used to mate with the indention 31 on the sleeve 9 when a sleeve 9 is docked on a base 19. The protrusion 11 may be circular or other shapes may be used. The base 19 may also have smaller protrusions 12 that mate with indentions 32 on the sleeve 9. The smaller protrusions 12 may be circular or other shapes may be used.

Mobile electronic devices 7 may have user displays that may be orientated in portrait or landscape positions. Mobile electronic devices 7 may automatically change the orientation of the user screen based on how the mobile electronic device 7 is being held. The smaller protrusions 12 on the base 19 may be used to easily locate typical operating positions of the mobile electronic device 7 when docked on the base 19. The protrusion 11 may include the driver coil cover 13. The driver coil cover may be made of durable material and thin allowing a driver coil 4 of the base 19 to be located near the surface that will mate with the indention 31 of the sleeve 9. The base 19 housing may be made of ferrous material. The base 19 housing may be made of plastic. Ferrous material may be used to fabricate the base 19 outer ring 18. The outer ring when made of ferrous material may be used to attract larger magnets 34 in the sleeve 9 to the base 19 and hold the sleeve 9 and mobile device securely. A simplified representation of a wall is shown. Standard wall material such as drywall may be used for 20 and 21. Wood or metal studs 21 may be used to support sheets of drywall forming wall in a home or building. The in-wall base 19 may be mounted in a wall and occupying space created by the studs 21 separating the sheets of drywall 20 and 21.

The in-wall base 19 when installed in a wall is nearly flush with the surface of the drywall 20. The base 19 may be installed in a vertical wall or a horizontal surface. Horizontal and vertical surfaces where the base 19 may be mounted maybe found in homes, buildings and vehicles such as automobiles, motor homes, boats and aircraft. The base 19 may be constructed as a free standing module with a mating surface for the sleeve 9 at any useful angle or with a mating surface for the sleeve 9 that allows the mating surface angle or plane to be adjustable. In this example, the base 19 has protrusions and the sleeve 9 has indentations. In other embodiments, the base 19 may have indentations and the sleeve 9 may have protrusions. In other embodiments, the base 19 may have both protrusions and indentations and the sleeve 9 may have both protrusions and indentations.

Figure 7:
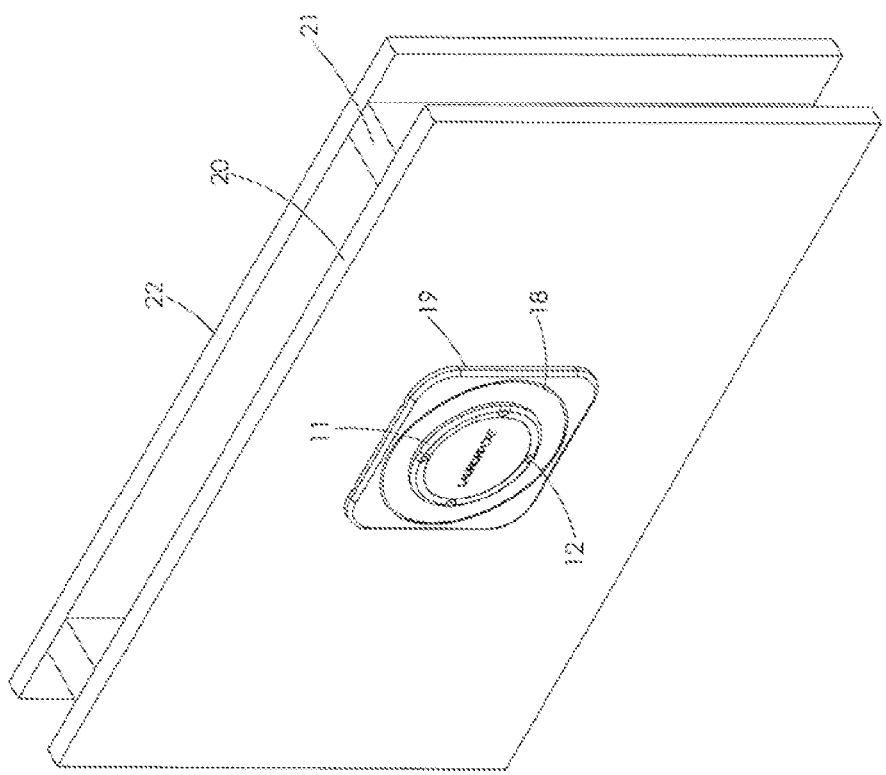
FIG. 7 is a front perspective view of an example docking system in-wall base.

Referring to the drawing FIG. 7, is a front perspective view of a docking system in-wall base. The in-wall base 19 may be very similar to the table top base 10 described in FIG. 1 through FIG. 5. The in-wall base 19 may have a protrusion 11 that may be used to mate with an indention 31 on the sleeve 9 when the sleeve 9 is docked on the base 19. The protrusion 11 may be circular or other shapes may be used. The base 19 may also have smaller protrusions 12 that mate with indentions 32 on the sleeve 9. The smaller protrusions 12 may be circular or other shapes may be used. Mobile electronic devices 7 may have user displays that may be orientated in portrait or landscape positions. Mobile electronic devices 7 may automatically change the orientation of the user screen based on how the mobile electronic device 7 is being held. The smaller protrusions 12 on the base may be used to easily locate typical operating positions of the mobile electronic device 7 when docked on the base 19. The protrusion 11 may include the driver coil cover 13. The driver coil cover 13 may be made of durable material and thin allowing the driver coil 4 of the base 19 to be located near the surface that will mate with the indention 31 of the sleeve 9.

The base 19 housing may be made of ferrous material. The base 19 housing may be made of plastic. Ferrous material may be used to fabricate the base 19 outer ring 18. The outer ring 18 when made of ferrous material may be used to attract larger magnets 34 in the sleeve 9 to the base 19 and hold the sleeve 9 and mobile electronic device securely. A simplified representation of a wall is shown. Standard wall material such as drywall may be used for 20 and 21. The in-wall base may be mounted in a wall and occupying space created by the studs 21 separating the sheets of drywall 20 and 21. The in-wall base 19 when installed in a wall may be nearly flush with the surface of the drywall 20. In this example, the base 19 has protrusions and the sleeve 9 has indentations. In other embodiments, the base 19 may have indentations and the sleeve 9 may have protrusions. In other embodiments, the base 19 may have both protrusions and indentations and the sleeve 9 may have both protrusions and indentations.

Figure 8:
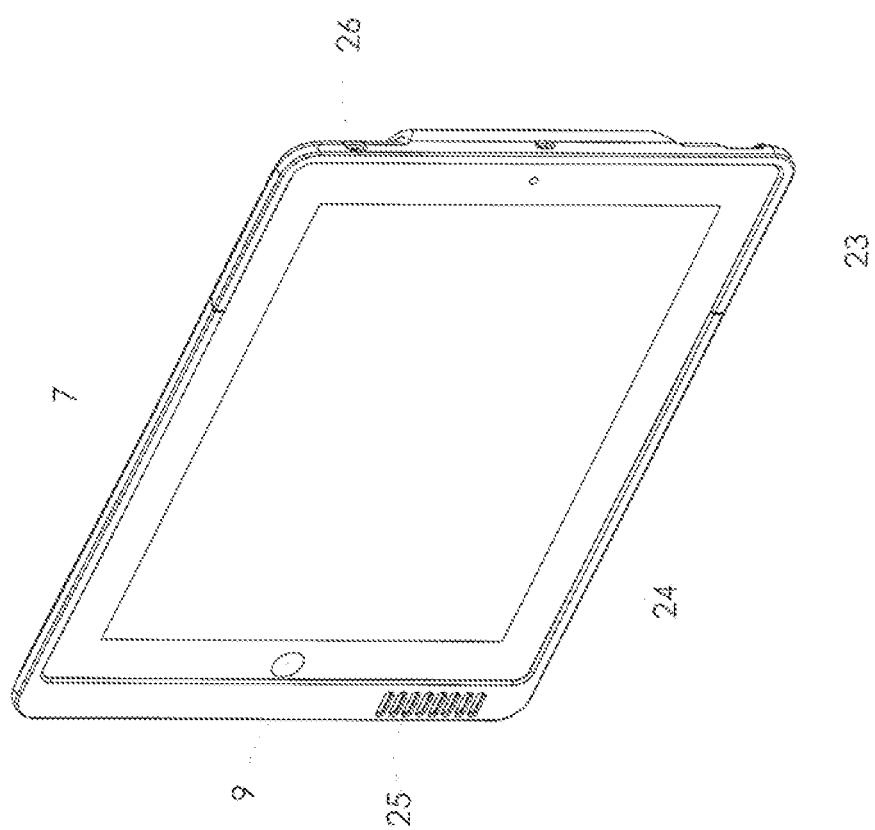
FIG. 8 is a front perspective view of an example docking system sleeve and mobile electronic device.

Referring to the drawing FIG. 8, is a front perspective view of a docking system sleeve and mobile electronic device. The sleeve 9 is used to hold a mobile electronic device 7. The sleeve 9 may be made one or more parts. A sleeve 9 may have a longer part 24 that the mobile electronic device is placed into followed by the shorter part 23 that may be installed next completing the sleeve 9. The sleeve 9 shorter part may have mechanical design feature that allow it to snap together with the larger part 24 of the sleeve 9. The longer part 24 and shorter part 23 of the sleeve 9 may be made with plastic material and fabricated using a molding process. The sleeve 9 may have openings 26 that allow access to ports on the mobile electronic device 7 allowing accessories such as cables to be plugged in to the mobile electronic device 7 while it is held by the sleeve 9. The sleeve 9 may have openings 25 that may be used to allow audio from speakers of the mobile electronic device 7 to exit the sleeve 9. The openings 25 may also be used for ventilation of the mobile electronic device 7 while it is held in the sleeve 9. The sleeve 9 may have an outer coating of soft touch paint or similar material. The use of soft touch paint or similar material may be used improve the users grip when holding the sleeve 9.

Figure 9:
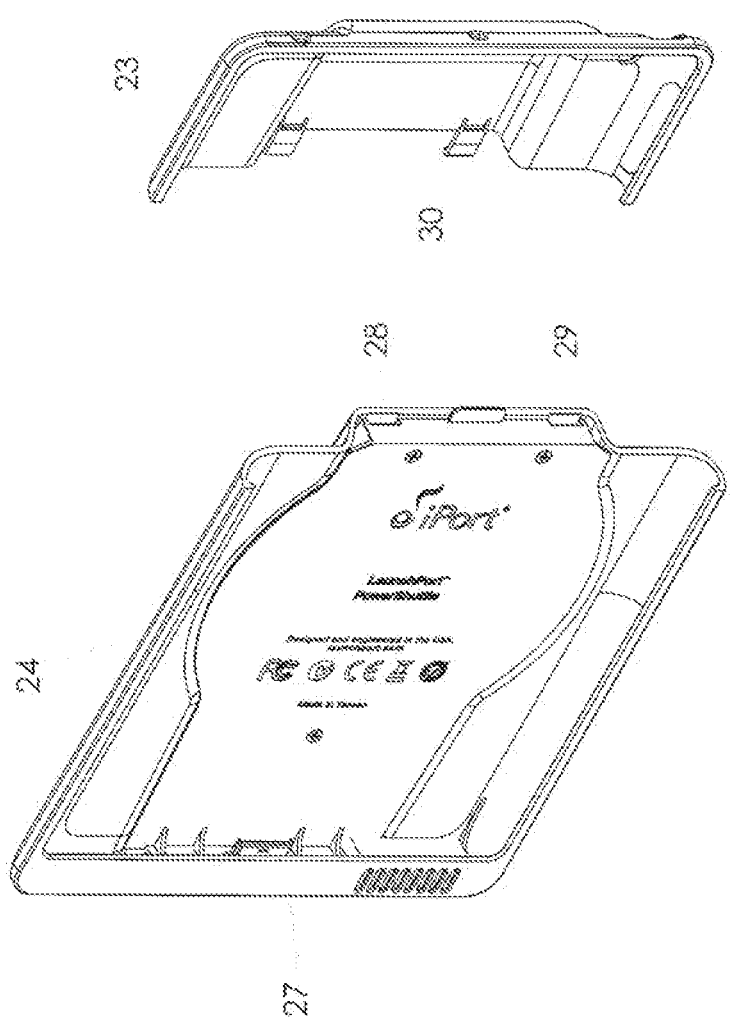
FIG. 9 is a front perspective exploded view of an example docking system sleeve.

Referring to the drawing FIG. 9, is a front exploded perspective view of a docking system sleeve. The sleeve 9 may be made one or more parts. The sleeve 9 may have a longer part 24 that the mobile electronic device is placed into followed by the shorter part 23 that may be installed next completing the sleeve 9. The sleeve 9 shorter part may have mechanical design feature that allow it to snap together with the larger part 24 of the sleeve 9. The mechanical snapping feature may be implemented using a ramped shaped part 28 and a hook shaped part 30. The ramp shape part 28 may snap together with hook shaped part 30 when the sleeve 9 longer part 24 is mated with the sleeve 9 shorter part 23 mechanically holding the two parts together. The sleeve 9 may include an electrical connector port 27 that mates with the charging port on mobile electrical device 7 when the mobile electrical device 7 is installed in the sleeve 9. The sleeve longer part may have a cover 29. The cover 29 provides a cover for the receiver coil 5, the main board 6 and connector board 8 shown in FIG. 1.

Figure 10:
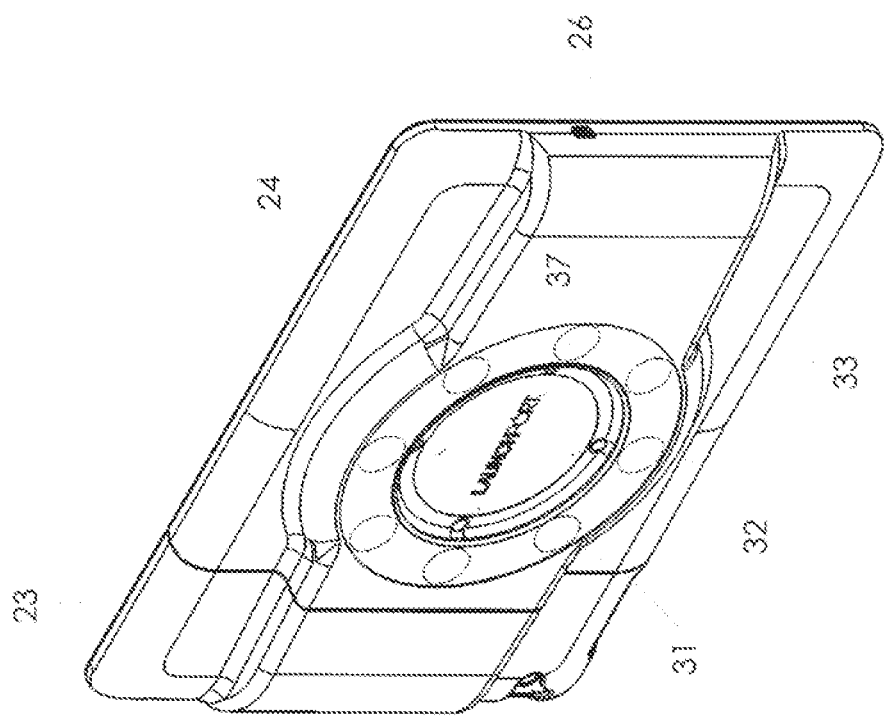
FIG. 10 is a rear perspective view of an example docking system sleeve.

Referring to the drawing FIG. 10, is a rear perspective view of a docking system sleeve. The sleeve 9 may have one or more parts. A sleeve 9 may have a longer part 24 and a shorter part 23. The sleeve 9 may have 31 an indentation that may mate with the corresponding protrusion 11 on the base 10. The indentation 31 may be circular or other shapes may be used. A sleeve 9 may have multiple smaller indentations 32 that may mate with the corresponding protrusions on the base 10 and may be used to locate useful positions of the mobile electronic device 7 when the mobile electronic device 7 is in the sleeve 9 and docked on the base 10. The smaller indentations 32 may be circular or other shapes may be used. The sleeve 9 may have a magnet cover 33 that covers larger magnets 34 in the sleeve 9. The magnet cover 33 is made of thin material that allows the larger magnets 34 in the sleeve 9 to be close to the ferrous material in the base 10. The sleeve 9 may have a receiver coil cover 37 that covers the receive coil and smaller magnets 35 in the sleeve 9. The receiver coil cover 37 may be made of thin material so the receiver coil 5 is near to the driver coil 4 of the base 10 and the sleeve 9 smaller magnets 35 are near to the ferrous material in the base 10. A sleeve 9 may have a connection port that serves as an alternate method to charge the mobile electronic device 7 using a conventional charger and cable.

Figure 11:
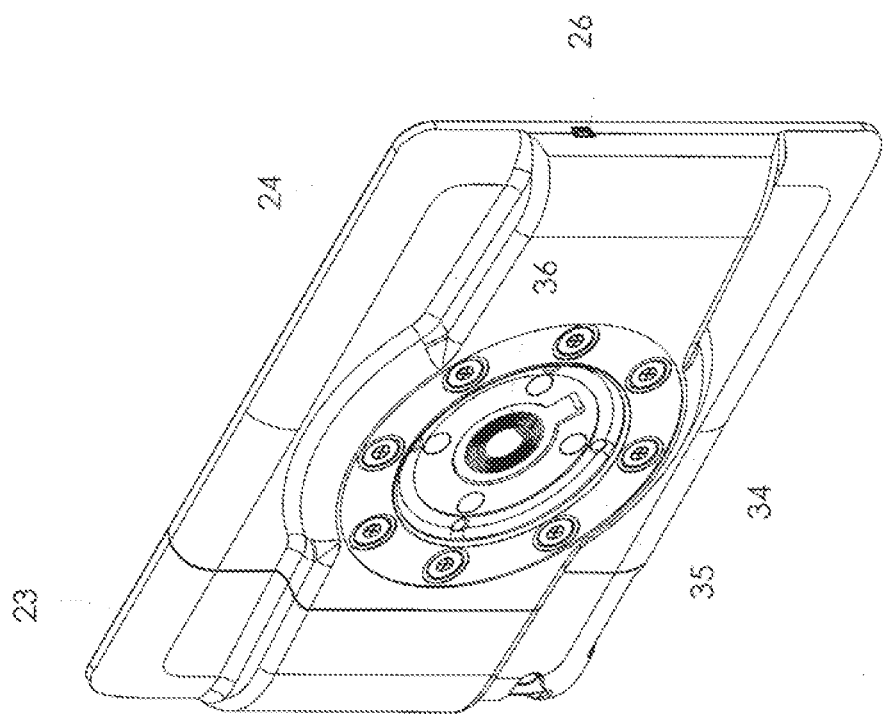
FIG. 11 is a rear perspective view of an example docking system sleeve without cover.

Referring to the drawing FIG. 11, is a rear perspective view of a docking system sleeve without cover.

The sleeve 9 may have one or more parts. A sleeve 9 may have a longer part 24 and a shorter part 23. A receiver coil 36 may be fabricated as a printed circuit board as shown in FIG. 11. The receiver coil 36 may be thin when fabricated as a printed circuit board. Multiple smaller magnets 35 may be used to hold the sleeve 9 to the base 10. Multiple larger magnets 34 may be used to hold the sleeve 9 to the base 10. The larger magnets 34 may be used to provide magnetic force to hold the sleeve securely to the in-wall base housing 19 which may require more force than the table top base 10. A sleeve 9 may have a connection port 26 that permits and alternate method to charge the mobile electronic device 7 using a conventional charger and cable.

Figure 12:
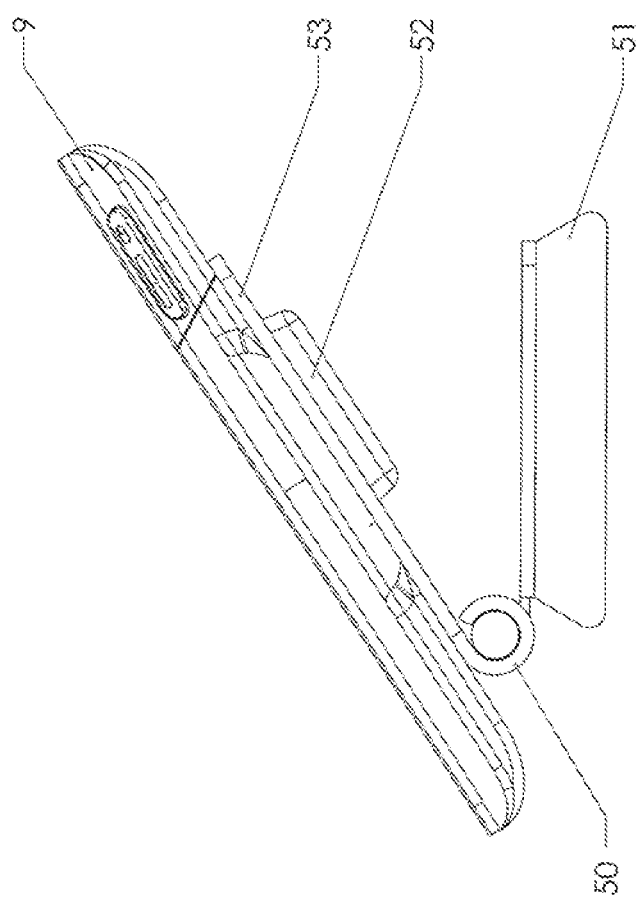
FIG. 12 is a side view of an example docking system with an adjustable base.

Referring to the drawing FIG. 12, is a side view of a docking system with an adjustable base. The docking system may have a mechanical feature that allows the angle at which the sleeve 9 is supported to be adjustable to multiple angles or planes. For example, a hinge 50 or similar mechanical feature could be used to allow docking surface supporting the sleeve 9 to be adjustable to multiple angles. The hinge 50 may have enough mechanical resistance to motion, after adjusted to the desired angle by the user, so the mobile electronic device 7 held in the sleeve 9 can be used while docked on the base 51.

The mechanical resistance may be accomplished with the hinge 50 mechanical design and optionally include a locking feature that locks the angle of the docking surface 53 in place at multiple angles. The user could adjust the angle that the mobile electronic device 7 is held to an angle of their choice either before docking the sleeve 9 or after the sleeve 9 was docked. Ferrous material may be used in the base 51 and covered by the docking cover 52. Magnets may be included in the sleeve 9. The magnets in the sleeve 9 may be attracted to the ferrous material in the base 51 and hold the sleeve 9 to the base 51 while the sleeve 9 is docked on the base 51. The sleeve 9 may rotate to multiple positions on axis within a single plane while docked on the base 51. The docking surface 53 of the base 51 may be adjustable to multiple angles or planes. The docking cover 52 can be used to cover the method of charging the mobile electronic device 7. Inductive or conductive charging may be included in the docking system. The docking system be used to just hold the sleeve 9 in some configurations and may not include charging in those configurations.

Figure 13:
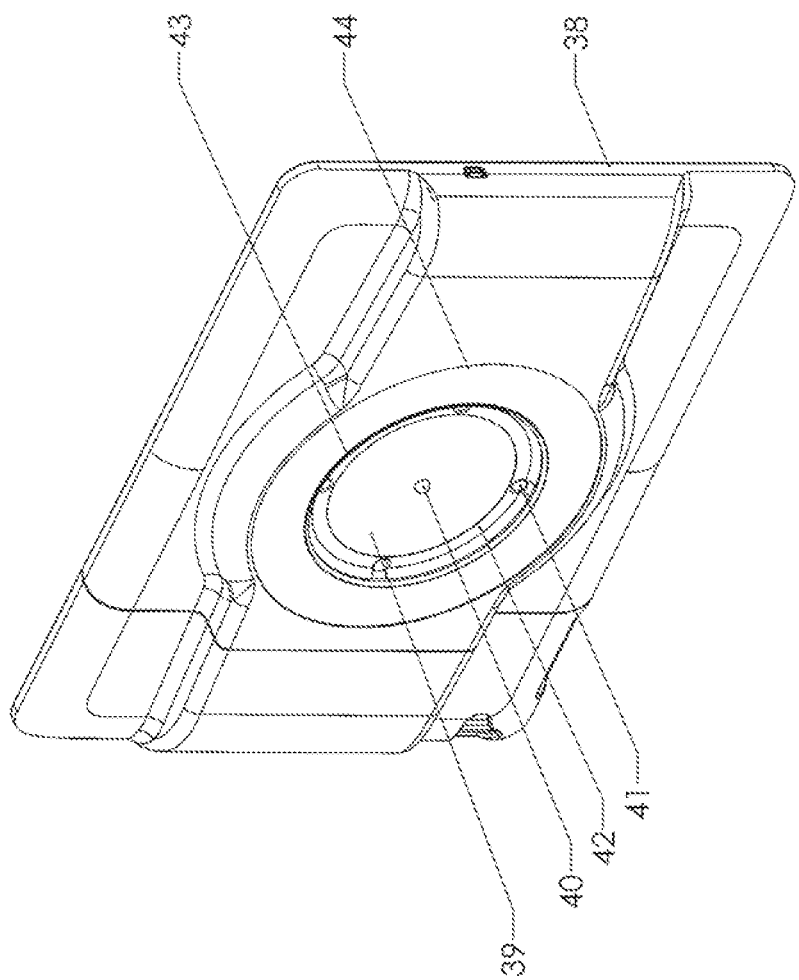
FIG. 13 is a rear perspective view of an example docking system conductive charging sleeve.

Referring to the drawing FIG. 13, is a rear perspective view of a docking system conductive charging sleeve. The docking system may use a conductive method to charge the mobile electronic device 7. Conductive charging may include electrical receiver contacts 55 to provide a method to transfer electrical power used for charging the mobile electronic device 7 from the base 45 to the sleeve 38. For example, the conductive charging sleeve 38 may have a receiver contact 40 located in the center of surface that mates with the base 45 when docked. The sleeve 38 may have a receiver contact that may be implemented as a conductive ring 42. The receiver contacts 55 of the sleeve 38 may be made of conductive material and or plated with conductive material.

The conductive ring 42 may include small indentations 41. The sleeve 38 may have an indentation 43 that may mate with the corresponding protrusion 48 on the base 45. The indentation 38 may be circular or other shapes may be used. A sleeve 9 may have multiple smaller indentations 41 that may mate with the corresponding protrusions 47 on the base 45 and may be used to locate useful positions of the mobile electronic device 7 when the mobile electronic device 7 is rotated on axis while docked on the base 45. The smaller indentations 41 may be circular or other shapes may be used. The sleeve 38 may have a magnet cover 33 that covers larger magnets 34 in the sleeve 38. The magnet cover 33 is made of thin material that allows the larger magnets 34 in the sleeve 38 to be close to the ferrous material in the base 45 when the sleeve 38 is docked on the base 45. The sleeve 38 may have a cover 39 that covers smaller magnets 35 in the sleeve 38. The cover 39 may be made of thin material so the smaller magnets 35 in the sleeve 38 are near to the ferrous material in the base 45. A sleeve 38 may have a connection port 26 that serves as an alternate method to charge the mobile electronic device 7 using a conventional charger and cable. In this example, the base 45 has protrusions and the sleeve 38 has indentations. In other embodiments, the base 45 may have indentations and the sleeve 38 may have protrusions. In other embodiments, the base 45 may have both protrusions and indentations and the sleeve 38 may have both protrusions and indentations.

Figure 14:
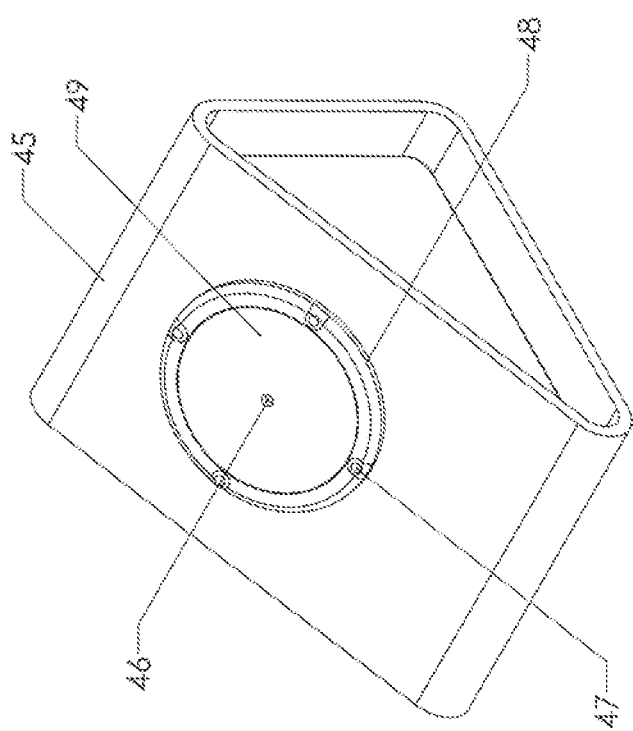
FIG. 14 is a side perspective view of an example docking system conductive base.

Referring to the drawing FIG. 14, is a side perspective view of a docking system conductive base. The base 45 may have a protrusion 48 that may be used to mate with an indention 43 on the sleeve 38 when the sleeve 38 is docked on the base 45. The protrusion 48 may be circular or other shapes may be used.

The base 45 may also have smaller protrusions 47 that mate with indentions 47 on the sleeve 38. The smaller protrusions 47 may be circular or other shapes may be used. Mobile electronic devices 7 may have user displays that may be orientated in portrait or landscape positions. Mobile electronic devices 7 may automatically change the orientation of the user screen based on how the mobile electronic device 7 is being held. The smaller protrusions 47 on a base 45 may be used to easily locate desired operating positions of the mobile electronic device 7 when docked on the base 45. The protrusion 48 may include a cover 49. The cover 49 may be made of durable material and thin allowing ferrous material of the base 45 to be located near the surface that will mate with the indention 43 of the sleeve 38. The sleeve 38 may have magnets in the indention 43 and be attracted to the ferrous material in the base 45. The magnetic force of the magnets in the sleeve 38 may hold the sleeve 38 to the base 45 while docked.

The small protrusions 47 may be conductive. The small protrusions 47 may be plated with conductive material. The small protrusions may be spring loaded contact points that allow charging current to be transferred to contact points on the sleeve 38. The base 45 may have a small protrusion 46 in the center of the large protrusion 48. The small protrusion 46 may be conductive. The small protrusion 46 may be plated with conductive material. The small protrusion 46 may be a spring loaded contact point that allows charging current to be transferred to a contact point on the sleeve 38. The base 45 housing may be made of aluminum and fabricated using an extrusion process. In this example, the base 45 has protrusions and the sleeve 38 has indentations. In other embodiments, the base 45 may have indentations and the sleeve 38 may have protrusions. In other embodiments, the base 45 may have both protrusions and indentations and the sleeve 38 may have both protrusions and indentations.

Figure 15:
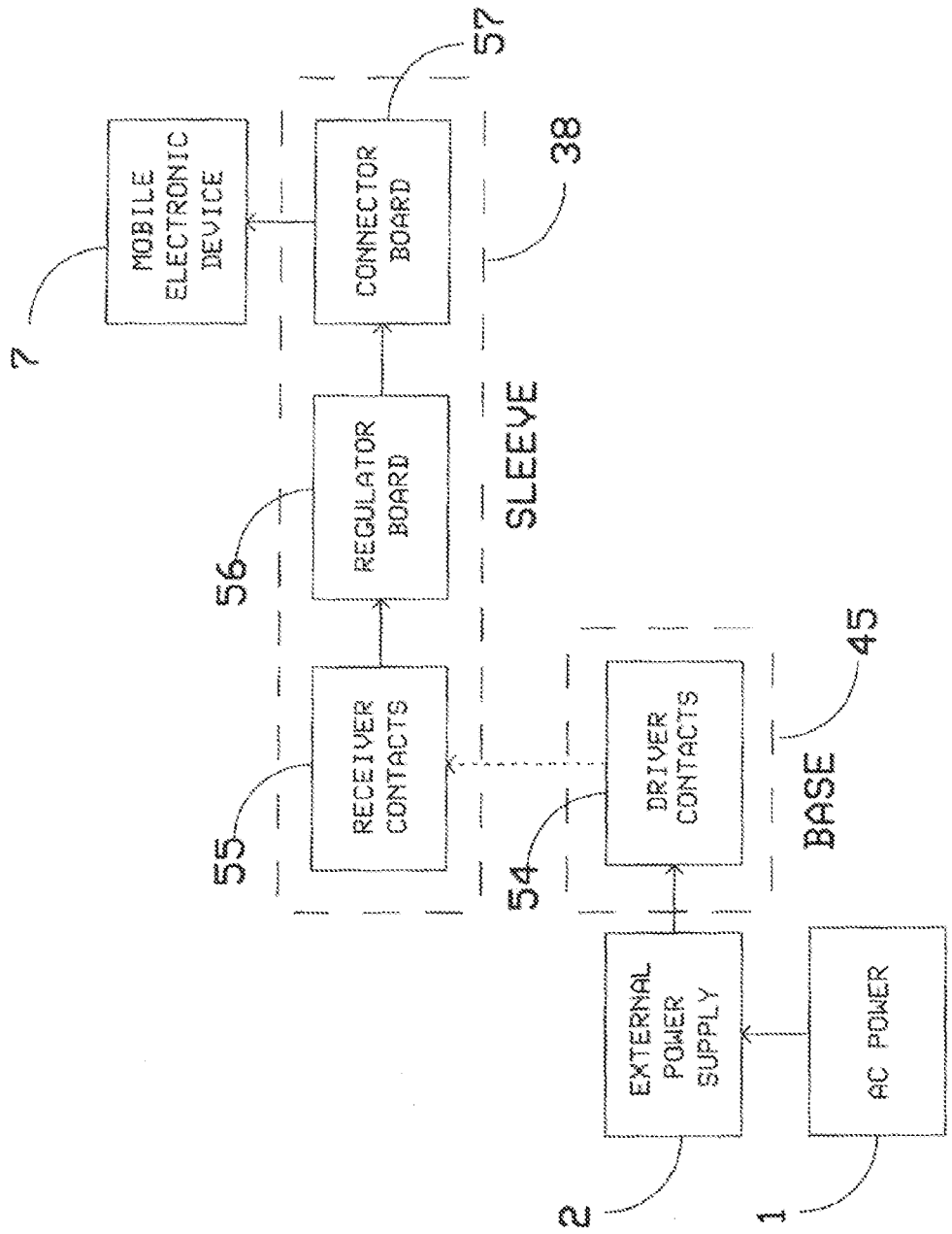
FIG. 15 is a block diagram of an example docking system conductive charging electronics.

Referring to the drawing FIG. 15, is a simplified block diagram of conductive charging electronics for a docking system. The use of driver contacts and receiver contacts and a conductive charging circuit in a docking station provides improvement over docking stations that require that the mobile electronic device be plugged in to a connector or cable that provides charging.

Referring more particularly to FIG. 15, AC power 1 may be used provide a source of power for a docking system. AC power 1 may range from 90 V AC to 240 V AC at 50 Hz to 60 Hz depending on where you are located in the world and other AC power voltages and frequencies may be used. The external power supply 2 receives input AC power 90 V AC to 240 V AC at 50 to 60 from AC power 1. The external power supply can be a wall mounted unit that is plugged directly in to an AC power 1 outlet and may use country specific plug adapters to mate with the style of AC power 1 outlet. A power source such as an external power supply 2 provides input power for the driver contacts 54 of the docking system base 45. A DC power input from a battery system in a vehicle such as an automobile for example may also be used in place of the AC power 1 and external power supply 2 to provide input to the driver contacts. The driver contacts 54 are used to transfer power the sleeve 38 when the sleeve 38 is docked on the base 45. The driver contacts 54 may be spring loaded insuring a good electrical contact with the receiver contacts 55 on the sleeve 38. The driver contacts 54 and receiver contacts 55 may be made of conductive material and further may be plated with gold or other highly conductive material improved conduction and reduce contact resistance. The receive contacts 55 are used to receive the power transferred from the driver contacts 54.

The regulator board 56 receives the power input from the receiver contacts 55. The regulator board 56 may be located in a sleeve 38. The power input from the receiver contacts 55 may be rectified in to DC voltage by a full wave bridge or half wave bridge on the regulator board 56. Alternately, if a DC voltage source is used for the driver contact 54 power then a full wave bridge or half wave bridge is not needed to create DC voltage. The DC voltage from the full or half wave bridge rectifier or DC power input from the receiver contacts 55 may be used as the input for a DC to DC switching power regulator circuit on the regulator board 56. The use of a switching power regulator on the regulator board 56 may improve the efficiency from 20% to nearly 90% of the conversion of unregulated DC voltage input to regulated voltage output over the use of conventional linear voltage regulators. The switching power regulator may be configured to output regulated +5 VDC output or other voltage for charging a mobile electronic device 7. The output of a regulator board's 56 regulated DC output is used as the input to a connector board 57.

The connector board 57 may be located in the sleeve 38 and may include a mating connector for the charging port on the mobile electronic device 7. The connector board 57 may also include a connector that is accessible from the outside of the sleeve 38 that allows an alternate method to charge the mobile electronic device 7 using a conventional charger. The mobile electronic device 7 charging port may plug in to a mating connector 27 on the connector board 57 when a mobile electronic device 7 inserted in to the sleeve 38. The sleeve 38 may be intended to remain in place on the mobile electronic device 7 semi-permanently and does not need to be removed for normal use of the mobile electronic device 7. The sleeve 38 may be form fitting and also may provide a level of increased protection for the mobile electronic device 7. The mobile electronic device 7 installed in the sleeve 38 may be placed on the base 45 to charge the mobile electronic device 7. Optionally, no additional plugging of cables or connectors are required to charge the mobile electronic device 7 when installed in the sleeve 38 and placed on the base 45 that is receiving power from an external power supply 2. The driver contacts 54 of the base 45 may need to be aligned properly with the receiver contacts 55 in the sleeve 38 to properly transfer power and allow charging of the mobile electronic device 7.

Smaller magnets 35 in the sleeve 38 may be used to attract to ferrous metal in the base 45. A combination of magnetic force and mechanical design features of a base 45 and a sleeve 38 may be used to enable the sleeve 38 to be easily docked properly aligning the receiver contacts 55 and the driver contacts 54 on the base 45 without excessive care from the intended user. The mechanical design features of the base 45 and the sleeve 38 also allow the sleeve 38 to be rotated to any position on axis within a single plane while a sleeve 38 is installed on the base 45. The magnetic force may be used to hold the base 45 and sleeve 38 together with enough force to allow the mobile electronic device 7 to be used normally while docked. The magnetic force between the sleeve 38 and base 45 may be such that it is not strong enough to prevent the mobile device 7 held in the sleeve 38 from easily being undocked by a user and used as a mobile electronic device 7.

Figure 16:
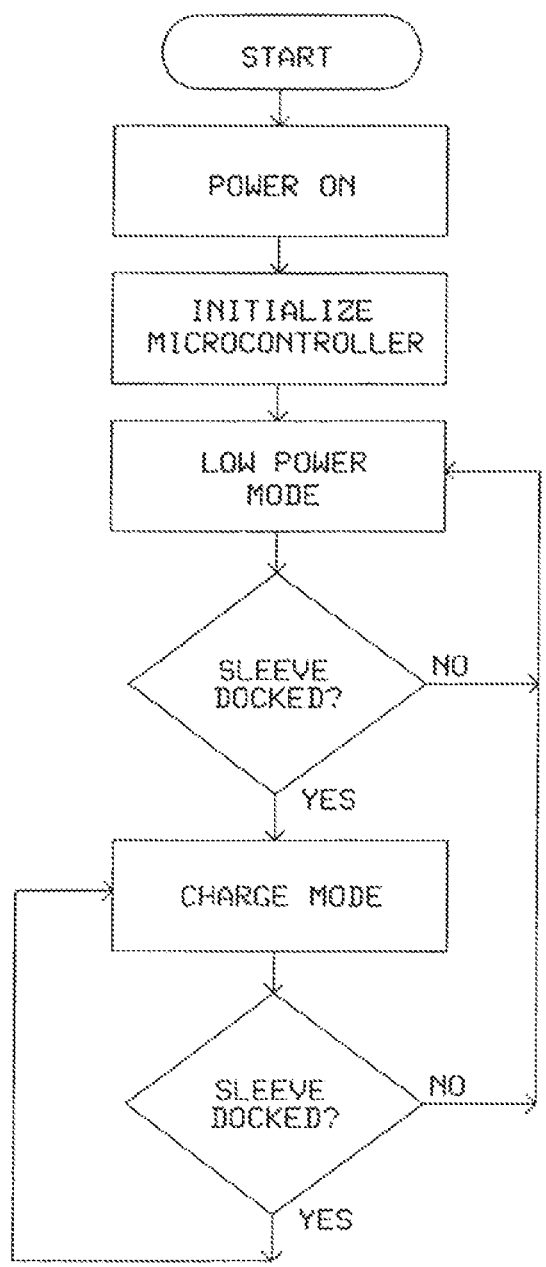
FIG. 16 is a simplified flow chart of an example process.

Referring to FIG. 16, FIG. 16 is a simplified flow chart of the operation of the docking system microcontroller firmware.

The microcontroller is initialized when the docking system has power applied from the external power supply. This is the POWER ON state of the docking system. The microcontroller next initializes the internal registers that control the input and output pin configurations and timers that may be used. After initialization is complete the system enters LOW POWER MODE. In LOW POWER MODE the charging function is disabled or OFF. The docking system may stay LOW POWER MODE and loop checking if a sleeve has been docked. When the docking system detects that a sleeve has been docked it will exit LOW POWER MODE and enter CHARGE MODE. The charging function is enabled or turned ON in CHARGE MODE. The firmware will remain in CHAR MODE and loop checking that a sleeve is still docked. If the sleeve remains docked on the docking system then CHARGE MODE will remain ON. If the sleeve is removed from the dock the docking system will return to LOW POWER MODE and the charge function will be turned OFF. The docking system will remain in LOW POWER MODE until a sleeve is docked and the process describe above will repeat indefinitely until power to the docking system is removed.

Certain systems and methods disclosed herein can be implemented in hardware, software, firmware, or a combination thereof. Software can include computer readable instructions stored in memory (e.g., non-transitory, tangible memory, such as solid state memory (e.g., ROM, EEPROM, FLASH, RAM), optical memory (e.g., a CD, DVD, Blu-ray disc, etc.), magnetic memory (e.g., a hard disc drive), etc., configured to implement the algorithms on a general purpose computer, special purpose processors, or combinations thereof. For example, one or more computing devices, such as a processor, may execute program instructions stored in computer readable memory to carry out processed disclosed herein. Hardware may include state machines, one or more general purpose computers, and/or one or more special purpose processors.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof in addition, while a number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

What is claimed is:

1. A docking system for a mobile electronic device, comprising:
    a mounting portion removably positionable onto a support surface, the mounting portion comprising a mounting surface that extends along a plane generally parallel to a base surface of the mounting portion;
    a mounting section on a rear surface of a mobile electronic device, the mounting section having a shape corresponding to a shape of the mounting portion and removably coupleable to the mounting portion via a coupling mechanism to support the mobile electronic device on the support surface;
    wherein one of the mounting portion and mounting section comprises one or more indexing members and the other of the mounting portion and mounting section comprises one or more indexing elements, the indexing members and elements configured to engage each other to align the mounting section with the mounting portion in one or more rotational orientations on said plane; and
    wherein the coupling mechanism comprises a magnet on one of the mounting portion and/or the mounting section, the magnet configured to exert a magnetic force between the mounting portion and mounting section to maintain the mounting portion coupled to the mounting section and the magnet is configured to exert a magnetic force in an amount sufficient to maintain the mounting section coupled to the mounting portion while adjusting the rotational orientation of the mounting section relative to the mounting portion, and the magnet is configured to exert a magnetic force between the mounting portion and mounting section in an amount sufficient to maintain the mobile electronic device, and a display thereon, in a generally vertical orientation.

2. The system of claim 1, wherein the mounting section is disposed on a sleeve removably attachable to the mobile electronic device.

3. The system of claim 1, wherein the mounting portion is pivotable relative to a horizontal plane to one or more angular positions that define a different angle between the mounting surface and the horizontal plane.

4. The system of claim 1, wherein one of the mounting portion and mounting section defines a male component and the other of the mounting portion and mounting section defines a female component, the female component configured to removably receive the male component to couple the mounting portion to the mounting section, and a circumference of the mounting portion and mounting section is circular in shape and extends about a central axis.

5. The system of claim 1, wherein the mounting portion is configured to attach to a wall.

6. The system of claim 1, wherein said indexing members and indexing elements align the mounting portion and mounting section so as to align an electrical connection between the mounting portion and mounting section.

7. The system of claim 1, wherein one of the indexing members and indexing elements comprises a plurality of protrusions and the other of the indexing members and indexing elements comprises a plurality of indentations sized to engage the protrusions and the protrusions and indentations are spaced apart along at least a portion of a circumference of the mounting portion and mounting section so as to align the mounting section with the mounting portion in one or more discrete rotational orientations on said plane.

8. The system of claim 1, wherein the mounting portion includes a first coil coupled to the driver circuit and the mounting section includes a second coil configured to inductively receive power from the first coil.

9. The system of claim 1, wherein the mounting portion includes a first coil coupled to the driver circuit and the mounting section includes a second coil configured to inductively receive power from the first coil, wherein the second coil is configured to inductively receive power from the first coil regardless of the mounting section's orientation in said plane.

10. The system of claim 1, further comprising:
    a detector configured to detect the presence of the mounting portion or the mobile electronic device;
    a driver circuit; and
    a first device configured to control the sourcing of power to the mobile electronic device by the driver circuit at least partly in response to the detector detecting the presence of the mounting portion or the mobile device.

11. The system of claim 1, wherein the mounting portion and mounting section are configured to conductively provide power to the mobile electronic device when mounting section is coupled to the mounting portion.

12. A mounting base comprising:
a mounting component, the mounting component including a receiving area configured to removably receive a mating device at a plurality of orientations within a plane,
wherein the mounting component comprises one or more indexing members configured to engage one or more indexing elements on the mating device, or the mounting component comprises one or more indexing elements configured to engage one or more indexing members on the mating device, to align the mating device with the mounting component in one or more rotational orientations on said plane; and
the mounting component further comprising a coupling mechanism for removably coupling the mating device to the mounting component, the coupling mechanism comprising one of (a) a magnet or (b) a magnetizable element configured to exert a magnetic force between the mounting component and the mating device to maintain the mating device coupled to the mounting component with a magnetic force in an amount sufficient to maintain the mating device couple to the mounting component while adjusting the rotational orientation of the mating device relative to the mounting component, and to exert a magnetic force between the mating device and the mounting component in an amount sufficient to maintain the mating device on the mounting component when oriented in a generally vertical orientation.

13. The mounting base of claim 12, wherein the mating device comprises a sleeve configured to receive a tablet computing device.

14. The mounting base of claim 12, wherein the mating device comprises a tablet computer or a phone.

15. The mounting base of claim 12, further comprising a driver circuit for providing power to a mating device and a driver coil coupled to the driver circuit, wherein the driver coil is configured to inductively provide power from the driver circuit to the mating device while the mating device is located at the receiving area.

16. The mounting base of claim 12, further comprising a driver circuit for providing power to the mating device and wherein the mounting base is configured to conductively provide power from the driver circuit to the mating device while the mating device is located at the receiving area.

17. The mounting base as defined in claim 12, wherein the first device is configured to cause, at least in part, the driver circuit to operate in a low power mode when the detector fails to detect a proper positioning of the mating device with respect to the receiving area.

18. The mounting base as defined in claim 12, wherein the detector magnetically senses the presence of the mating device.

19. The mounting base as defined in claim 12, wherein a circumference of the receiving area is circular in shape and defined about a central axis of symmetry.

20. The mounting base as defined in claim 12, wherein the mounting component comprises a magnet or a ferrous metal configured to magnetically couple the mounting base to the mating device.

21. The mounting base of claim 12, further comprising:
a detector configured to detect the presence of the mating device;
a driver circuit; and
a first device configured to control the sourcing of power to the mating device by the driver circuit at least partly in response to the detector detecting the presence of the mating device.

22. A docking system for a mobile electronic, comprising:
a mounting portion removably positionable onto a support surface, the mounting portion comprising a mounting surface that extends along a plane generally parallel to a base surface of the mounting portion;
a mounting section on a rear surface of a mobile electronic device, the mounting section having a shape corresponding to a shape of the mounting portion and removably coupleable to the mounting portion via a coupling mechanism to support the mobile electronic device on the support surface;
wherein one of the mounting portion and mounting section comprises one or more indexing members and the other of the mounting portion and mounting section comprises one or more indexing elements, the indexing members and elements configured to engage each other to align the mounting section with the mounting portion in one or more rotational orientations on said plane; and
wherein the mounting section is disposed on a sleeve removably attachable to the mobile electronic device and wherein the sleeve comprises one or more heat sinks configured to dissipate heat generated by one or both of a charging circuit of the sleeve and the mobile electronic device.

23. The system of claim 22, further comprising:
a detector configured to detect the presence of the mounting portion or the mobile electronic device;
a driver circuit; and
a first device configured to control the sourcing of power to the mobile electronic device by the driver circuit at least partly in response to the detector detecting the presence of the mounting portion or the mobile device.

24. The system of claim 22, wherein the mounting portion and mounting section are configured to conductively provide power to the mobile electronic device when the mounting section is coupled to the mounting portion.

* * * * *